(12) United States Patent
Haacke et al.

(10) Patent No.: US 9,097,782 B2
(45) Date of Patent: Aug. 4, 2015

(54) CATALYTIC MULTIECHO PHASE UNWRAPPING SCHEME

(75) Inventors: E. Mark Haacke, Detroit, MI (US); Wei Feng, Ann Arbor, MI (US)

(73) Assignee: MAGNETIC RESONANCE INNOVATIONS, INC., Detroit, MI (US)

( * ) Notice: Subject to any disclaimer, the term of this patent is extended or adjusted under 35 U.S.C. 154(b) by 626 days.

(21) Appl. No.: 13/461,488

(22) Filed: May 1, 2012

(65) Prior Publication Data

US 2013/0002247 A1 Jan. 3, 2013

Related U.S. Application Data (60) Provisional application No. 61/481,687, filed on May 2, 2011.

(51) Int. Cl.
*G01R 33/565* (2006.01)
*G01R 33/561* (2006.01)

(52) U.S. Cl.
CPC ...... *G01R 33/56545* (2013.01); *G01R 33/5615* (2013.01)

(58) Field of Classification Search
CPC .............. G01R 33/56545; G01R 33/5615
USPC ................................. 324/300–322
See application file for complete search history.

(56) References Cited

U.S. PATENT DOCUMENTS

| | | | | |
|---|---|---|---|---|
| 5,485,085 A | * | 1/1996 | Sumanaweera et al. | 324/307 |
| 5,539,316 A | * | 7/1996 | Sukumar | 324/320 |
| 5,652,513 A | * | 7/1997 | Liu et al. | 324/306 |
| 5,783,942 A | * | 7/1998 | Bernstein et al. | 324/306 |
| 6,459,922 B1 | | 10/2002 | Zhang | |
| 7,196,518 B2 | | 3/2007 | Yatsui et al. | |
| 2004/0056660 A1 | | 3/2004 | Yatsui et al. | |
| 2008/0258725 A1 | | 10/2008 | Hetherington et al. | |
| 2009/0253983 A1 | | 10/2009 | Foo et al. | |
| 2010/0119138 A1 | | 5/2010 | Hulbert | |

OTHER PUBLICATIONS

International Search Report and Written Opinion for PCT Application No. PCT/US2012/035989, mailed Aug. 10, 2012, 13 pages.
Olsrud et al., MRI Thermometry in Phantoms by Use of the Proton Resonance Frequency Shift Method: Application to Interstitial Laser Thermotherapy, taken from: http://lup.lub.lu.se/luur/download?func=downloadFile&recordOId=1112693&fileOId=2371692, Apr. 17, 1998, 18 pages.

* cited by examiner

*Primary Examiner* — Dixomara Vargas
(74) *Attorney, Agent, or Firm* — Foley & Lardner LLP (57) ABSTRACT

A method of nuclear magnetic resonance imaging of an object is disclosed, the method including: receiving MR data including magnitude and phase information generated using an MR scan having a series of different echo times; generating one or more measured MR images based on the MR data; and processing the measured MR images to generate unaliased or substantially unaliased phase information for at least one pixel in the image.

16 Claims, 6 Drawing Sheets

CATALYTIC MULTIECHO PHASE UNWRAPPING SCHEME

CROSS REFERENCE TO RELATED APPLICATIONS

This application claims the benefit of U.S. Provisional Application No. 61/481,687, filed May 2, 2011, the entire contents of which are incorporated herein by reference.

BACKGROUND

Magnetic resonance (MR) imaging is a useful noninvasive method for imaging the internal components of a wide array of objects. Its noninvasive imaging of tissue in living subjects, especially humans, is highly valued in the medical field.

Phase information obtained in MR imaging applications may contain valuable information useful in a number of imaging techniques, including susceptibility weighted imaging techniques of the type described in U.S. Pat. No. 6,658,280, issued Dec. 2, 2003, the entire contents of which are incorporated herein by reference.

However, phase based MR imaging techniques may suffer from unwanted artifacts caused by phase wrapping or aliasing. For example, SWI typically utilizes phase information obtained using a gradient echo sequence with a long echo time (TE). However, due to long TE, phase aliasing occurs. For the purpose of SWI, phase wraps can be removed by conventional region growing methods or homodyne filtering. However, region growing phase unwrapping methods are not always reliable and conventional homodyne highpass filtering induces undesired artifacts.

SUMMARY

Applicants have appreciated that in some MR imaging applications featuring multiple echoes, phase wrapping may be reduced or eliminated, e.g., on a pixel by pixel basis, by leveraging information derived from multiple echoes. For example, the phase advancement occurring between two echoes may be calculated, e.g., using complex division of MR images corresponding to each of the echoes. This calculated phase advancement can be combined with the measure phase at an earlier echo time to predict the phase at a later echo time. The predicted phase can be compared to the measured phase at the later echo time. If the predicted and measured phases differ by more than a threshold amount, phase wrapping has been detected. The measured phase may then be modified (e.g., by addition or subtraction of multiples of $2\pi$, until the predicted and modified measured phase match within the threshold level). For multi echo sequences, this technique may be applied iteratively to images acquired at successive echoes to reduce or eliminate all phase wrapping for the complete imaging sequence.

In one aspect, a method of nuclear magnetic resonance imaging of an object is disclosed, the method including: receiving MR data corresponding to n complex MR images generated using an MR scan having a series of n different echo times, where n is an integer equal to two or more, each image corresponding to a respective echo time. The method also includes processing the images to correct phase wrap aliasing, the processing including: i) complex dividing a second image corresponding to the second echo time with a first image corresponding to the first echo time to create a divided complex image; ii) using a scaling of the phase from the divided complex image to determine a predicted phase at one or more pixels in the second image; iii) for one or more pixels in the second image, comparing the predicted phase with a measured phase, and if the difference between the predicted phase and the measured phase lies within a first threshold range, leaving the measured phase in the second image unchanged; if the difference between lies outside the first threshold range, changing the measured phase value by adding multiples of $2\pi$ until the difference falls within the threshold range.

In some embodiments, the processing further includes: v) using a scaling of the phase from the divided complex image to determine a predicted phase at one or more pixels in a third image by adding a scaling of the phase to the corresponding phase from first or the second image; vi) for one or more pixels in the third image, comparing the predicted phase with a measured phase, and if the difference lies within a first threshold range, leaving the measured phase in the second image unchanged; if the difference lies outside the first threshold range, changing the measured phase value by adding multiples of $2\pi$ until the difference falls within the threshold range.

Some embodiments include iteratively continuing the processing for images corresponding to the remaining n−3 echo times.

In some embodiments, for at least one pixel, a phase difference between the first image and the second image, $\Delta\phi(r)$, computed based on complex division, is added to the phase in the first image to create a predicted phase $\phi_{new}(r,TE2)$.

Some embodiments include, for at least one pixel, comparing the predicted phase $\phi_{new}(r,TE2)$ with the measured phase $\phi(r,TE2)$ in the second image and: if $\phi_{new}(r,TE2)-\phi(r,TE2)$ is less than or equal to a threshold value, leaving $\phi(r,TE2)$ unmodified, if $\phi_{new}(r,TE2)-\phi(r,TE2)$ is greater than a threshold value then adding or subtracting a multiple q of $2\pi$ until the absolute value of $(\phi_{new}(r,TE2)-\phi(r,TE2)+/-q2\pi)$ is less than a given value $\epsilon$.

In some embodiments, $\epsilon$ is about $0.1\pi$ or less. In some embodiments, for each pixel, $\epsilon$ is set to $\alpha\pi$ where $\alpha$ depends on a signal-to-noise ratio (SNR) in a magnitude image corresponding to at least one of the complex images. In some embodiments, $\alpha$ is set to a multiple of 1/SNR. In some embodiments, $\alpha$ is set to about 3/SNR.

In some embodiments, a corrected phase from the nth echo is used as input for an SWI analysis or SWIM analysis, where n can be any integer between 1 and p where p is the total number of echoes collected in the scan.

In some embodiments, processing the images to correct phase wrap aliasing includes determining at least one low signal pixel in the MR images having a signal to noise ratio below a threshold level; and omitting the low signal pixel from the processing.

Some embodiments include acquiring the MR data. In some embodiments, acquiring the MR data includes acquiring magnitude data $\rho(r)$ and phase data $\phi(r)$ corresponding to each echo time. Some embodiments include Fourier transforming the k-space data to create magnitude data $\rho(r)$ and phase data $\phi(r)$ (these are MR images).

In some embodiments, the generated MR images include magnitude and phase images or a complex image.

In another aspect, a method of nuclear magnetic resonance imaging of an object is disclosed, the method including: receiving MR data (e.g., from one or more RF coils) including magnitude and phase information generated using an MR scan having a series of different echo times; generating one or more measured MR images based on the MR data; and processing the measured MR images to generate unaliased or substantially unaliased phase information for at least one pixel in the image. Some embodiments include processing the measured MR images to generate unaliased or substantially unaliased information for substantially all pixels in the image.

In some embodiments, at least one image (e.g., a two or three dimensional image) is generated for each echo time.

Some embodiments include generating a first complex image based on the MR data corresponding to a first echo time; generating a second complex image based on the MR data corresponding to a second echo time; and generating a phase difference image based on the first and second complex images.

In some embodiments, the phase difference image is generated by complex division of the first complex image with the second complex image In some embodiments, the measured MR images include a first series of images corresponding to a first set of echo times and a second series of images corresponding to a second set of echo times different from the first set of echo times.

Some embodiments include modifying the images in the first set of images based on complex division with at least one image from the first set of images. Some embodiments include generating a subtraction of two phase images in performing the complex division.

Some embodiments include modifying the images in the second set of images based on complex division with at least one image from the second set of images, e.g., to produce.

In some embodiments, modifying the images in the first set of images includes: modifying the first set of images, based on first phase difference information generated based on the complex division, to generate a first set of modified MR images.

In some embodiments, modifying the images in the second set of images includes: modifying the second set of images, based on second phase difference information generated based on the complex division, to generate a second set of modified MR images.

Some embodiments include, further modifying the first set of modified images based on the second phase difference information.

Some embodiments include, for at least one pixel: calculating a predicted phase value at a respective echo time based on MR data from at least two echo times.

Some embodiments include comparing the predicted phase to a corresponding measured phase and if the difference between the predicted phase and measured phases is within a threshold range, modifying the measured phase by adding or subtracting multiples of $2\pi$ to bring the difference within the threshold range.

Some embodiments include generating a modified image based on the modified measured phase.

In some embodiments, at least some of the MR data corresponds to a gradient echo scan.

In some embodiments, at least some of the MR data corresponds to a gradient echo planar scan.

Some embodiments include correcting for eddy current gradient induced phase effects by subtracting a phase value at or near the center of an image for either or both of even and odd phase images and after creating an anti-aliased image adding this offset back. In some embodiments, the offset may be different for even versus odd images.

In another aspect, a system including: a processor configured to receive MR data and process the data using the methods set forth above and herein. Some embodiments include an MR imager in communication with the processor and configured to generate the MR data.

In another aspect, a computer program product is disclosed including a non-transitory computer usable medium having a computer readable program code embodied therein, said computer readable program code adapted to be executed to implement any of the methods described above or herein.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The drawings are not necessarily to scale, emphasis instead generally being placed upon illustrating the principles of the invention.

DETAILED DESCRIPTION

Figure 1:
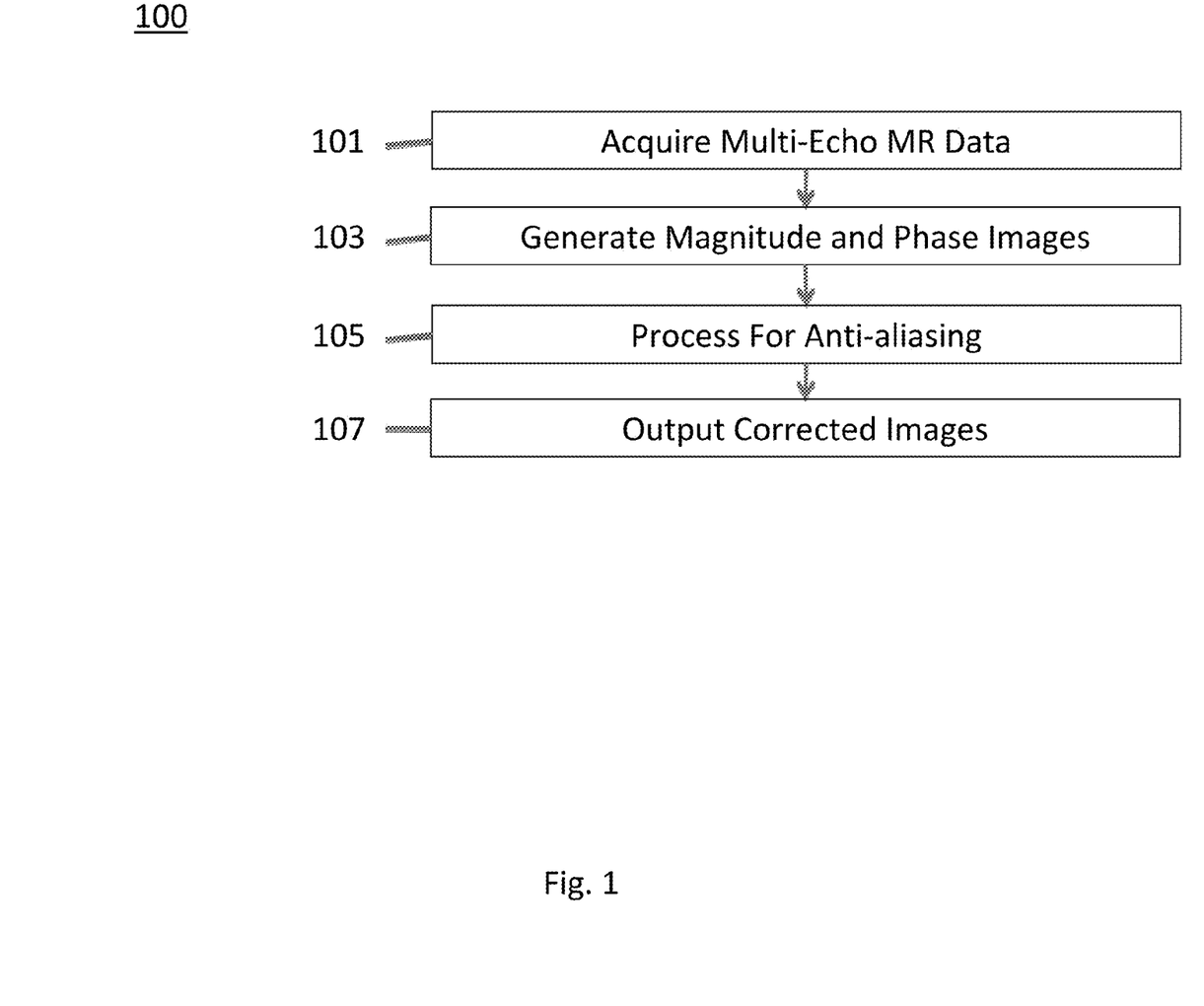
FIG. 1 shows an exemplary process for reducing or eliminating phase aliasing.

Referring to FIG. 1, a process 100 is illustrated for generating MR images with reduced or eliminated phase aliasing. In step 101, MR imaging data is acquired at a series of different echo times, e.g., using a multi-echo gradient echo (GRE) or gradient echo planar scan. The imaging data acquired at each scan may include magnitude information $\rho(r)$ and phase information $\phi(r)$ (as used herein, r is a spatial variable ranging over the imaged region). The imaging data may be represented as a matrix in 1, 2, 3, or more dimensions for each echo time.

In step 103, the MR data is processed (e.g., by application of a Fourier transform) to generate magnitude and phase images (and/or combined complex images) for each echo time. The images may be 1, 2, or 3 dimensional images. The images may be digital images, made up of pixels (or, in the 3 dimension case voxels). It is to be understood that, as used herein, the term pixel may be used interchangeably with the term voxel, as appropriate.

In step 105, the MR images are processed to reduce, substantially eliminate, or eliminate phase aliasing using processing techniques of the type described herein. In step 107, phase aliasing corrected images are output, e.g. for display, storage, further processing, etc.

Figure 2:
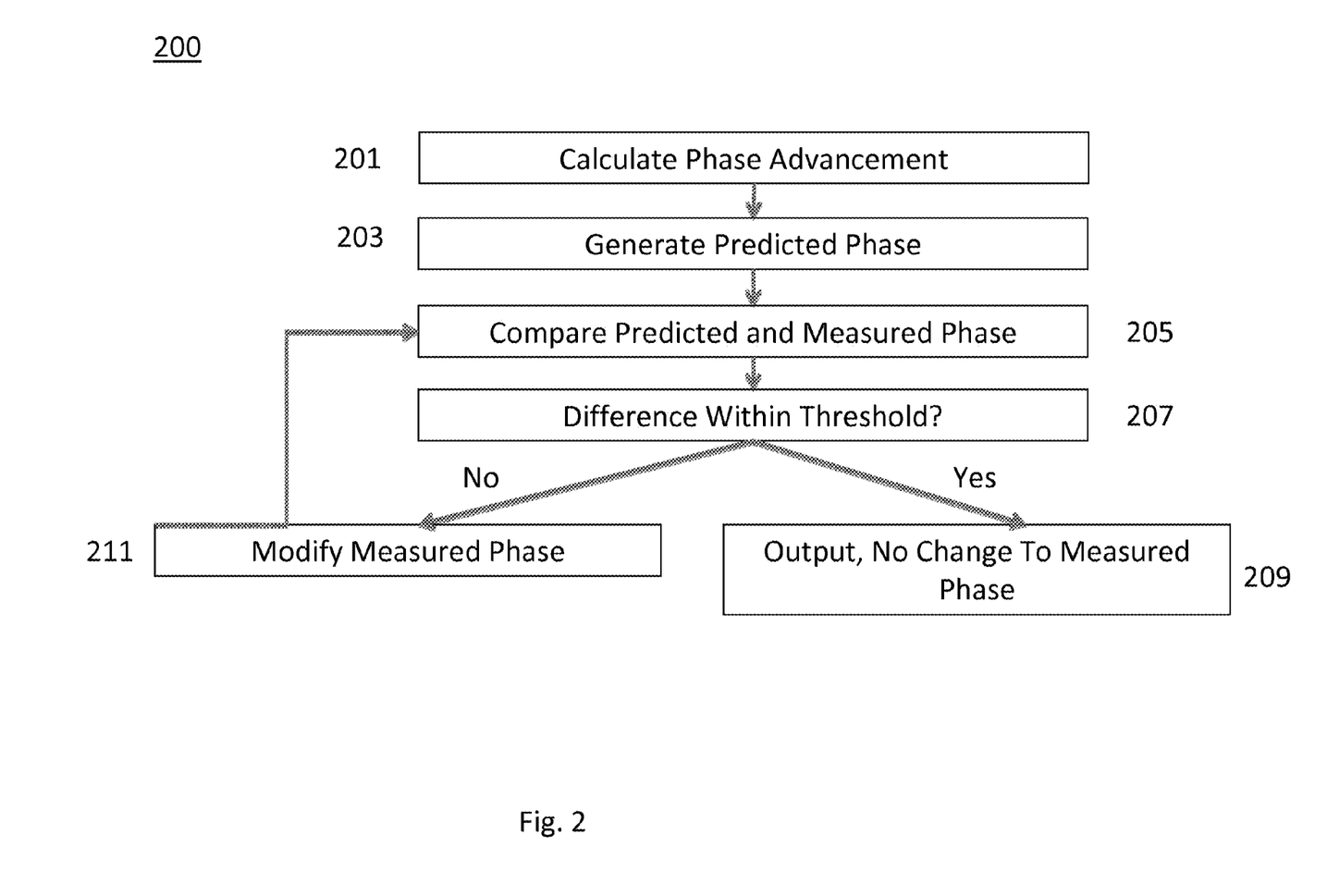
FIG. 2 shows an exemplary process for correcting phase wrapping.

Referring to FIG. 2, a process 200 is illustrated for reducing or eliminating phase aliasing suitable for use in step 105 of the process 100 of FIG. 1. In step 201, the phase advancement between two echo times (e.g., the first and second echo time, adjacent echo times, or arbitrarily chosen echo times) is calculated. In some embodiments, the phase advancement is calculated using measured complex MR images corresponding to the two echo times. The complex images are complex divided, and the phase advancement calculated on a pixel by pixel basis based on this division.

In step 203, the calculated phase advancement is used in conjunction with the measured phase at the earlier of the two echo times to generate a predicted phase (again on a pixel by pixel basis) at the later echo time. In some embodiments, additional processing is used to generate the predicted phase. For example, as described in detail in the example below, a correction may be applied to compensate for unwanted linear phase terms, e.g., caused by eddy current related effects.

In step 205, the predicted phase is compared to actually measured phase at the later echo time. In some embodiments, the absolute value of the difference between the predicted and measured phases is calculated on a pixel by pixel basis.

In step 207, this comparison of step 205 is used to determine if the difference between the predicted and measured phase is within the threshold range (e.g., less than or equal to a threshold value). If so, the measured phase does not require any phase unwrapping, and so is left unchanged and output in step 209.

If the difference between the predicted and measured phase is outside the threshold range (e.g., greater than the threshold value) phase aliasing is indicated. In step 211, the measured phase is modified, e.g., by addition or subtraction of $2\pi$. The process 200 then returns to step 205, and steps 205, 207, and 211 repeated until the difference between the modified measured phase and the predicted phase is within the threshold range, at which point the process moves to step 209, and the modified measured phase is output.

In various embodiments, the threshold level for the difference between the predicted and measured phase may be set at any arbitrary value. In some embodiments, the threshold value $\epsilon$ is equally to $\alpha\pi$ where $\alpha$ is equal to 0.5 or less, 0.2 or less, 0.1 or less, etc., e.g., about 0.1. In some embodiments, $\alpha$ may be determined on a pixel by pixel basis based on a parameter related to the pixel. For example, $\alpha$ may be determined based on a signal to noise ratio (SNR) For example, the SNR may be determined based on the MR signal magnitude at the pixel. In some embodiments, $\alpha$ is set equal to about 1/SNR, about 2/SNR, about 3/SNR or any other suitable value.

As will be understood by one skilled in the art, the above described process can be repeated for multiple pixels to generate a phase aliasing corrected phase image on a pixel by pixel basis at the later echo time. This corrected phase image can than be used as the basis for further processing, repeating the steps described above to correct another image at a later echo time. This iterative or "bootstrapping" process may be repeated as many timed as necessary to correct images corresponding to each of the echo times in the MR imaging scan. The available phase information may be used to correct the image corresponding to the first echo time as well.

In some embodiments, the bootstrapping process described above can be applied successively to images at adjacent echo times. In other embodiments, the sequence of images may be divided into sub-sequences (e.g., corresponding to even and odd echo times), with the bootstrapping process being applied first within each sub sequence, and the across sub-sequences. In various embodiments, other suitable processing orders may be used.

In various embodiments, one or more of the corrected phase maps corresponding to the various echo times may be used as an input for further processing, e.g. an SWI analysis or SWI susceptibility mapping (SWIM) analysis of the type performed by analysis technology available from Magnetic Resonance Innovations, Inc. of 440 East Ferry St. Detroit, Mich.

Figure 3:
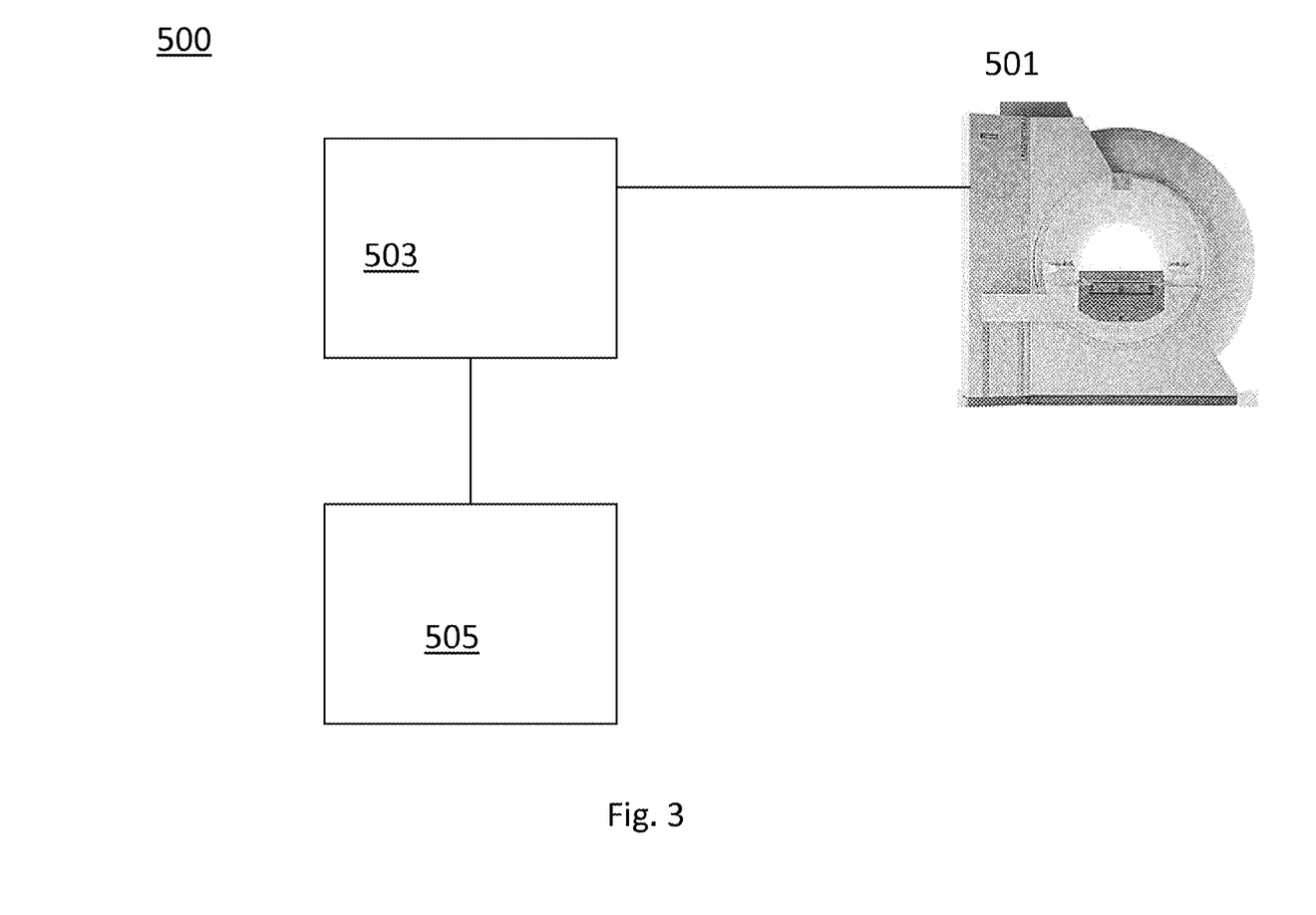
FIG. 3 is a block diagram of an MR imaging system.

Referring to FIG. 3, an exemplary MRI system 500 includes an MRI imager 501 (e.g., 3T VERIO MRI system, available from Siemens, Erlangen, Germany) which generates MR image data. The imager 501 is communicatively coupled to a processor 503, which receives the data from the imager 501 and processes the data using the techniques described herein. In some embodiments, imager 501 may be omitted, and processor 503 can receive data from some other source, e.g., storage memory. Processor 503 is communicatively coupled to a display 505 which displays information output from the processor In some embodiments, processor 503 does not receive MR data directly from imager 501, but instead receives image from another suitable source, e.g., a computer memory such as a hard drive.

Example

CAMPUS Processing Scheme

In the following example, the techniques described above are applied to provide a pixel by pixel anti-phase aliasing processing scheme referred to as CAtalytic Multiecho Phase Unwrapping Scheme (CAMPUS). In some embodiments, the scheme is applied to bipolar gradient echo sequences with short inter-echo spacing. In some embodiments, the method removes the need for 2D or 3D segmentation like algorithms and combined with forward susceptibility mapping methods reduces the reliance on heavily high pass filtered phase data.

In the following example, a multiecho gradient echo sequence with short inter-echo spacing is used to collect both magnitude and phase data. A total of 11 echoes with a variety of initial echoes and interecho spacings are used, as described below. However, it is to be understood that the technique may be applied to sequences with any other suitable number of echoes.

In the current example, the first echo is flow compensated in all 3 directions. The rest of the odd echoes in the sequence are flow compensated in the readout direction only. The even echoes are not flow compensated.

Ignoring flow-induced components, the phase at voxel location r at time t can be written as $$\phi(r, TE_i) = \phi_0 - \gamma \Delta B(r) TE_i + \theta_{l(i)}(x) \tag{1}$$

where $\phi_0$ is the initial phase shift, $\gamma$ is the gyromagnetic ratio, x is the coordinate of the voxel along the readout direction, $\Delta B_{LF}(r)$ is the local field variation caused by susceptibility effects, $\theta_{l(i)}(x)$ is the linear phase along the readout direction caused by eddy currents and gradient delays, l(i)

equals 1 when i is odd and l(i) equals 2 when i is even. It is assumed that the eddy current behavior reaches a steady state such that all the positive (negative) gradients induce the same linear phase. In Eq. (1), the local field variations caused by susceptibility effects are intrinsic to the imaged tissue and are the quantities that we want to estimate in order to achieve phase unwrapping. The eddy current gradient induced terms, on the other hand, are introduced by the imperfections of the gradient switching and need to be extracted and removed.

The echoes in the sequence are closely spaced echoes to make it easier to anti-alias on a pixel-by-pixel basis. Using a combination of the short echo spacings and also differences between these spacings or multiples of these spacings and the starting echo time, the equivalent of very short echo time differences can be obtained to unwrap even rather rapid aliasing. To perform the anti-aliasing or unwrapping, the inter-echo phase advancements are computed with complex division of the adjacent echo images. Taking into account the flow-induced component, the phase advancements from positive echo to negative echo ($\Delta\phi_{np}$) and from negative echo to positive echo ($\Delta\phi_{pn}$) can be written as, $$\begin{cases} \Delta\varphi_{np}(r, \Delta TE) = -\gamma\Delta B(r)\Delta TE - \gamma v M_1 + (\theta_2(x) - \theta_1(x)) \\ \Delta\varphi_{pn}(r, \Delta TE) = -\gamma\Delta B(r)\Delta TE + \gamma v M_1 - (\theta_2(x) - \theta_1(x)) \end{cases} \quad (2)$$

where $M_1$ is the first moment of the gradient at even echoes and $\gamma v M_1$ is the flow-induced phase advancement at the even echoes assuming constant velocity.

The eddy current gradient induced terms in Eq. (2) can be described by a constant phase term and a linear phase term as, $$\theta_2(x) - \theta_1(x) = mx + b. \quad (3)$$

To remove the eddy current gradient induced phase terms, the constant phase term b is removed first by subtracting the phase value at the center of the image for both the even and odd phase advancements. This removes any spatial phase wrap around the center of the $\Delta\phi$ images. Due to the presence of the slope term mx, phase wraps can still occur at the two ends of the $\Delta\phi$ images along the readout direction x. Methods to estimate m known in the art include the correlation based algorithms and the subspace identification approaches. A simple way to estimate m is to have the user manually select a strip along the readout direction that does not have large local field variations.

After removal of the eddy current induced phase terms, Eq. (2) becomes, $$\begin{cases} \Delta\varphi_{pn}(r, \Delta TE) = \gamma\Delta B(r)\Delta TE + \gamma v M_1 \\ \Delta\varphi_{np}(r, \Delta TE) = \gamma\Delta B(r)\Delta TE - \gamma v M_1 \end{cases} \quad (4)$$

Note for $\Delta TE$ short enough, after removal of the eddy current induced terms and assuming slow flow, the inter-echo phase advancement as shown in Eq. (4) induced by local field variation is small enough that there is no phase aliasing. The flow-induced term can be estimated by subtraction of $\Delta\phi_{np}$ and $\Delta\phi_{pn}$ in Eq. (4). Simple addition of the adjacent phase advancements shown in Eq. (4) gives $$\Delta\phi_{i,i+2}(r; 2\Delta TE) = \gamma\Delta B(r) 2\Delta TE \quad (5)$$

Note that there are now no phase wraps for the phase advancement for $2\Delta TE$ expressed in Eq. (5). The intrinsic local field variations can then be computed as $$\Delta B(r) = \frac{\Delta\varphi_{i,i+2}(r, 2\Delta TE)}{2\gamma\Delta TE} \quad (6)$$

With $\theta_2(x) - \theta_1(x)$ (Eq. (3)), flow-induced term $\gamma v M_1$ and $\Delta B(r)$ (Eq. (6)), the inter-echo phase advancements $\Delta\phi_{21}$ and $\Delta\phi_{32}$ can be unwrapped using Eq. (2) to get $\Delta\phi_{21}{}^{un}$ and $\Delta\phi_{32}{}^{un}$. The other inter-echo phase advancements can be unwrapped by, $$\begin{cases} \Delta\varphi_{43}^{un} = \Delta\varphi_{43} + 2\pi R_d((\Delta\varphi_{21}^{un} - \Delta\varphi_{43})/(2\pi)) \\ \Delta\varphi_{i,i-2}^{un} = \Delta\varphi_{i,i-2} + 2\pi R_d((\Delta\varphi_{i-2,i-4}^{un} - \Delta\varphi_{i,i-2})/(2\pi)), \end{cases} \quad (7)$$

$$i = 5, 6, \ldots, 11$$

where $R_d$ is the rounding operator (which operates on a number to round the number to the nearest integer). Notice that in Eq. (7), the unwrapping of the odd echoes with respect to echo one is done using only previously unwrapped odd echoes, and unwrapping of the even echoes is done using only the previously unwrapped even echoes. This unwrapping strategy is designed to reduce the effect of the flow-induced variations in phase in the readout direction because the odd echoes are flow-compensated in the readout direction, while the even echoes are not flow compensated.

The phase image for the first echo can be unwrapped using the estimated local field variations and the eddy current induced terms. The measured phase at the first echo can be written as $$\phi(r; l\ TE_1) = \phi_0 + \gamma\Delta B(r) TE_1 + \theta_1(x) - 2\pi N(r) \quad (8)$$

where $N(r)$ is the number of phase wraps at r at $TE_1$. To unwrap $\phi(r,TE_1)$, we will need to estimate $\phi_0$, which is assumed to be a constant over the whole image. One can also assume that $\phi_0 \in [-\pi, \pi)$. If one lets $$\varphi(r) = \phi(r, TE_1) - (\gamma\Delta B_{LF}(r)TE_1 + \gamma\Delta B_p(x)\Delta TE)$$

Then, $$\frac{\varphi(r) - \pi}{2\pi} \leq N(r) < \frac{\varphi(r) + \pi}{2\pi} \quad (9)$$

Once $N(r)$ is estimated, $\phi_0$ can be computed with Eq. (8). Note that the estimated $\phi_0$ may not be constant over the whole image, and care has to be taken to avoid phase wraps introduced by the estimation of $\phi_0$. With both $\phi_0$ and $N(r)$ in hand, one can estimate the true phase at echo 1 with Eq. (8).

Combining the unwrapped first echo and the unwrapped echoes with respect to the first echo gives the unwrapped phase images for all the echoes. Finally, if aliasing still persists, say in the presence of high iron content for example, or air/tissue interfaces if the $\Delta TE$ interval is too short, then one can use the echo difference of the first echo with the second and fourth echoes to further reduce aliasing, if the relative echo differences are small enough.

Figure 4:
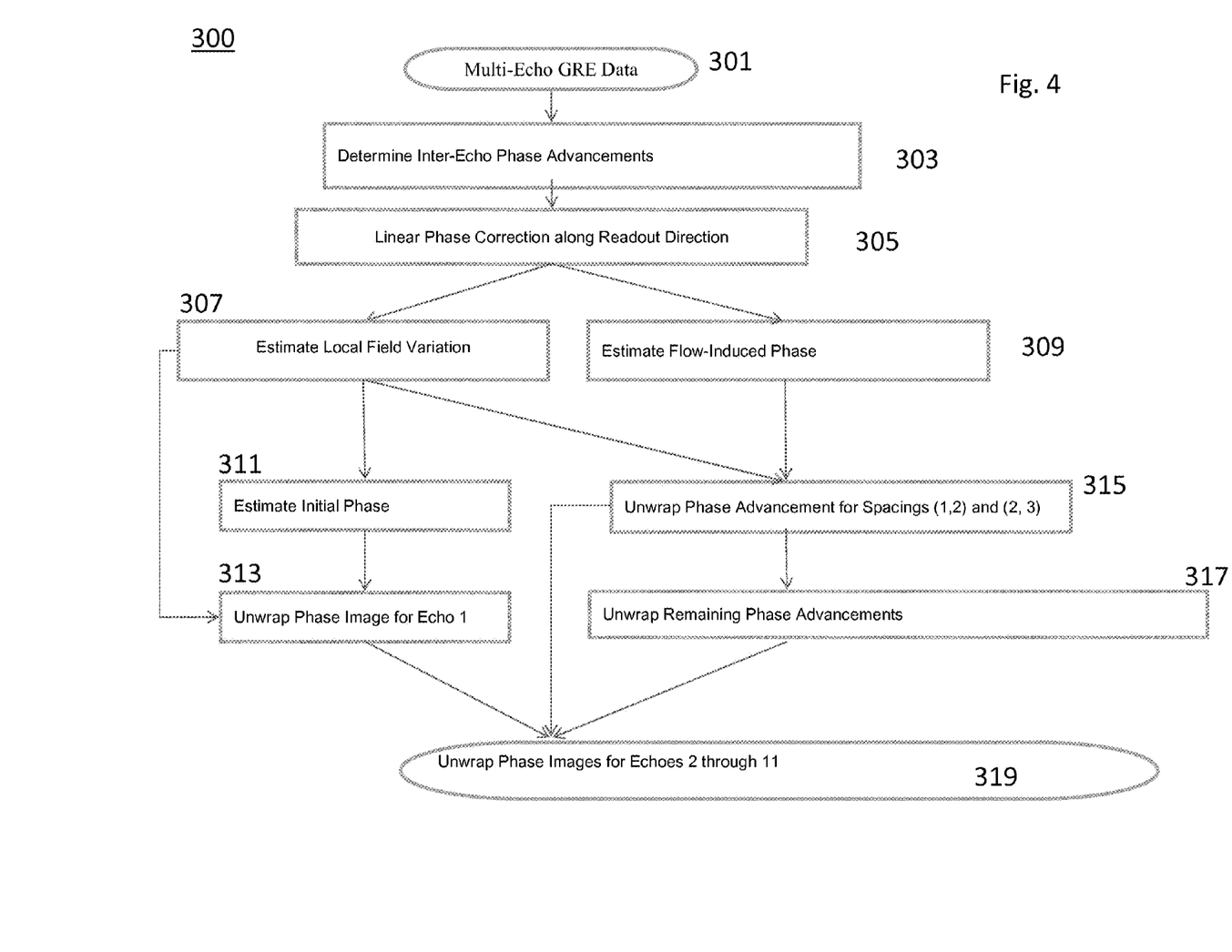
FIG. 4 is a flow diagram for a CAMPUS processing scheme applied to an 11 echo gradient echo pulse sequence.

FIG. 4 summarizes a process 300 for implementing the CAMPUS scheme described above. In step 301, gradient echo scan phase and magnitude data are acquired. In step 303, the inter echo phase advancement is calculated for adjacent echoes in an 11 echo scan. In step 305, linear phase correction is performed along the readout direction. In step 307, the local field variation is estimated. In step 309, the flow induced phase is estimated. In step 311, the initial phase is estimated. In step 313, the phase image for the first echo is unwrapped based in the estimated initial phase and the estimated local field variation. In step 315, the inter echo phase advancements for the first two inter echo periods are unwrapped based in the estimated local field variation and the estimated flow induced phase. In step 317, the inter echo phase advancements for the remaining inter echo periods are unwrapped iteratively based on the unwrapped inter echo phase advancements for the first two inter echo periods. In step 319, the phase images corresponding to echoes 2 through 11 are unwrapped based on the unwrapped inter echo phase advancements and from the unwrapped phase image corresponding to the first echo.

Example

CAMPUS for SWI

In the following example, the pulse sequence and processing scheme was applied to image the brain of human subjects. All experiments were performed on a 3T Siemens VERIO scanner equipped with 12 channel or 32 channel phased array coils.

For the 11 echo sequence, two different sets of scanning parameters were used. The first were: field-of-view (FOV)= 25.6 cm×19.2 cm, in-plane resolution=0.5 mm×0.5 mm, slice thickness=2 mm, flip angle=15°, 11 echoes, first echo at = 5.68 ms, an inter-echo spacing of =2.57 ms, last echo at = 31.38 ms, repetition time TR=37 ms, bandwidth (BW)=465 Hz/pixel. 64 slices were collected to form a matrix size of 512×384×64. For the second set the interecho spacing was changed to 3.7 ms.

For comparison, a double echo gradient echo sequence was used to acquire conventional SWI image. Flow compensation was implemented for all three directions. The scanning parameters were the same as the 11 echo sequence, except that the echo time was changed and BW was 150 Hz/pixel. The lower bandwidth is feasible for the double echo SWI and it increases the SNR. The echo time of the second echo of the double echo sequence was set to be equivalent to the echo time of the 9th echo of the 11 echo sequences.

CAMPUS processing was implemented in MATLAB to process the 11 echo images for each sequence. The last 5 unwrapped phase images then go through a regular highpass filter (instead of a homodyne filter designed for wrapped images) and the filtered phase images were used together with the corresponding magnitude images to form SWI images for each echo, which are then averaged to form a single SWI image. The images from the second echo of the double echo acquisition are processed to generate SWI images. The 11 echo SWI images are then compared to the double echo SWI images in terms of SNR and CNR.

Figure 5:
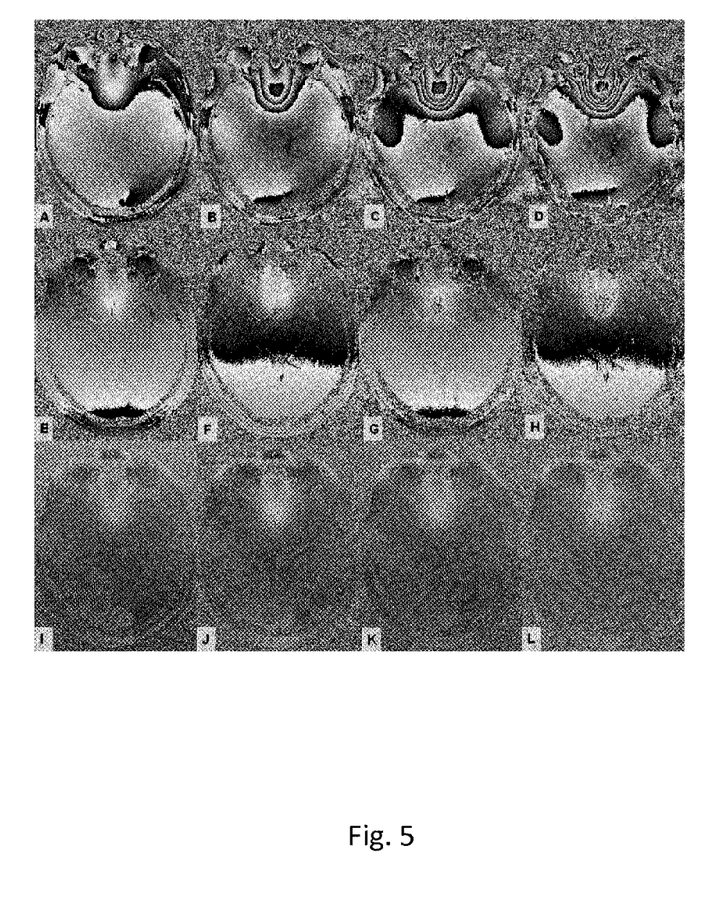
FIG. 5 shows MR phase images of a mid-brain slice for a normal volunteer acquired using a 3T, 11 echo scan, during a CAMPUS unwrapping process. The top row shows original phase images at echoes 1 (panel A), 4 (panel B), 7 (panel C) and 10 (panel D). The middle row shows phase advancements $\Delta\phi_{i+1,i}(r, \Delta TE)$, i=1, 4, 7, 10, from complex division of adjacent echoes for echo pairs (1,2) (panel E), (4,5) (panel F), (7,8) (panel G), and (10,11) (panel H). The bottom row shows unwrapped phase images (panels I-L) corresponding to original phase images of the top row (panels A-D). Note that in order to show more details for the unwrapped phase images, each unwrapped phase image is scaled to the full gray scale range using its minimum and maximum phase values.

FIG. 5 shows MR phase images of a mid-brain slice for a normal volunteer for the 3T, 11 echo sequence, during a CAMPUS unwrapping process. The top row shows original phase images at echoes 1 (panel A), 4 (panel B), 7 (panel C) and 10 (panel D). The middle row shows phase advancements $\Delta\phi_{i+1,i}(r, \Delta TE)$, i=1, 4, 7, 10, from complex division of adjacent echoes for echo pairs (1,2) (panel E), (4,5) (panel F), (7,8) (panel G), and (10,11) (panel H). The bottom row shows unwrapped phase images (panels I-L) corresponding to original phase images of the top row (panels A-D). Note that in order to show more details for the unwrapped phase images, each unwrapped phase image is scaled to the full gray scale range using its minimum and maximum phase values.

FIG. 5 shows some of the phase images during the unwrapping process. In the top row (panels A-D), the air-tissue interface induced local field variation is evident in the orbitofrontal area, where the number of phase wraps increases significantly as the echo time increases. In the middle row, panels E and G show the phase advancements from odd echoes to even echoes, and panels F and H show the phase advancements from odd echoes to the next even echoes. The inter-echo phase advancements clearly show gradient induced phase variations as a slope in the readout direction.

The unwrapped phase using CAMPUS for echoes 1, 4, 7 and 10 are shown in the bottom row, panels I-L. One can see that all of the phase wraps shown in the original phase images are unwrapped except for a few pixels where the fast arterial flow induced phase variation rendered an incorrect unwrapped phase.

Figure 6:
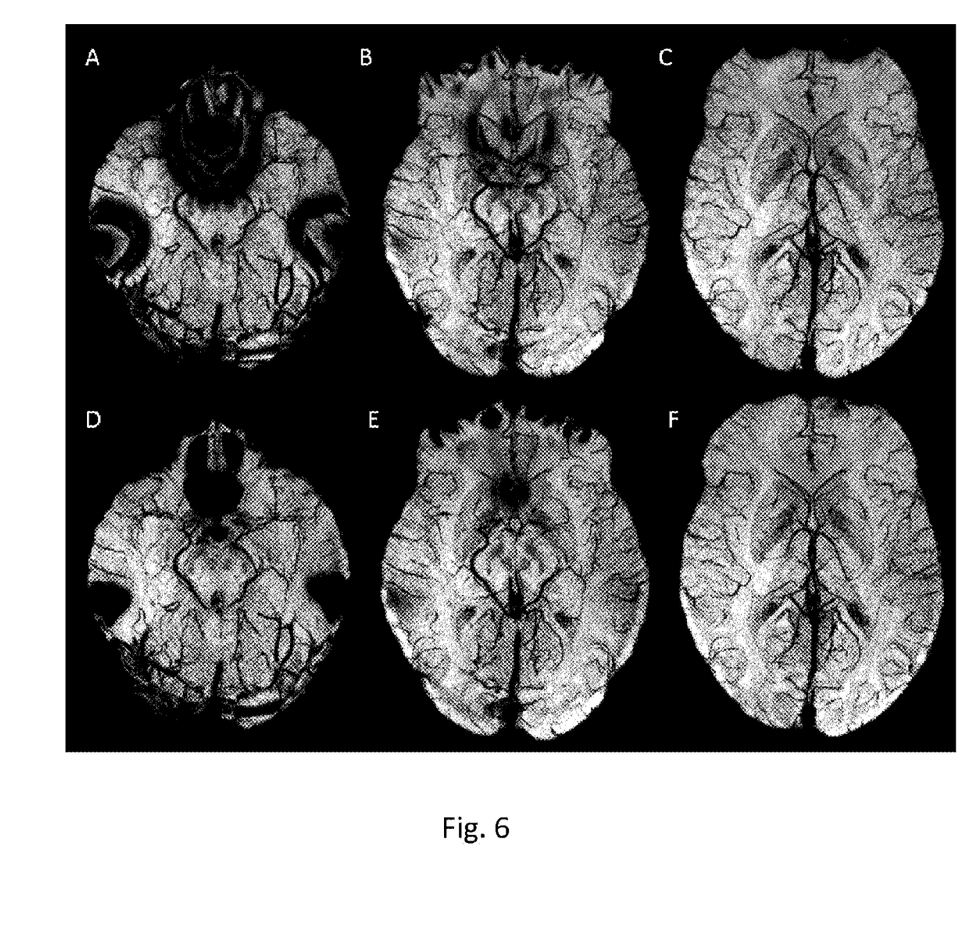
FIG. 6 shows multiecho SWI images using echoes 5 to 9 of an 11 echo sequence. The top row (panels A-C) shows SWI images generated with a conventional method of homodyne filtering of the phase images. The bottom row (panels D-F) shows SWI images generated with regular highpass filtering of CAMPUS-unwrapped phase images. From left to right, the columns show a mid-brain slice severely affected by the local field (panels A and D), a slice slightly higher but still in the mid-brain (panels B and E) and in the thalamostriate region (panels C and F). Note the field effects are significantly reduced with CAMPUS.

FIG. 6 shows multiecho SWI images using echoes 5 to 9 of the 11 echo sequence. The top row (panels A-C) shows SWI images generated with a conventional method of homodyne filtering of the phase images. The bottom row (panels D-F) shows SWI images generated with regular highpass filtering of CAMPUS-unwrapped phase images. From left to right, the columns show a mid-brain slice severely affected by the local field (panels A and D), a slice slightly higher but still in the mid-brain (panels B and E) and in the thalamostriate region (panels C and F). Note the field effects are significantly reduced with CAMPUS.

FIG. 6 shows advantageous performance of the CAMPUS scheme. For example, FIG. 6, (panel D) shows that the phase wrap induced artifact in the orbitofrontal area present in conventional SWI (panel A) is removed from the SWI image. The middle cerebral arteries (MCAs) are much more clearly illustrated free of the wrapping artifact. Panels B and E show the thalamostriate veins. In both images, the veins are shown with good contrast.

Although several exemplary pulse sequences are described above, in general, any suitable pulse sequence may be used. In a multi-echo sequence it is possible to use a variety of initial (first) echo times and echo spacings. The choice of first echo time is often kept as short as possible to enhance signal-to-noise and contrast-to-noise as well as minimize field effects on flow compensation. But, in some embodiments, this echo time may not be as short as possible, rather it may be chosen to create a desired effect, e.g., the cancellation of a certain tissue type in the generated images. For example, in some embodiments, the initial echo time is chosen to be at an in-phase or out-of-phase water/fat echo time to either remove phase differences between water and fat or to cause maximum cancellation between water and fat, respectively. One can also make the similar choices for the inter-echo spacings. For example at 3.0 T the echo time might be chosen to be in-phase at 7.8 ms followed by a series of echoes with echo spacing of 2.6 ms. All echo spacings need not be equal however, since often other information is encoded in between two echoes making it necessary to lengthen (or shorten) one echo time over another.

For creating phase images which are the least susceptible to magnetic field effects and aliasing, it is not necessary to have the inter-echo spacing as short as possible (although this may be desirable). For example, if the susceptibility difference between two tissue types is 10 ppm then the phase defined by $\gamma\Delta\chi B_0 TE$ will exceed $2\pi$ even if the echo time is 2.25 ms. Many MR systems are unable to shorten this time and keep high resolution images. There is another key approach to creating a new pseudo-echo image with any desired effective time which can be accomplished as follows: choose the first echo time TE1 so that TEeff=TE1−nΔTE (where ΔTE is the inter-echo spacing) is any number between zero and 2.25 in this particular number or between zero and any desired echo time difference, where n is an integer. Alternatively, a third echo time could be chosen so that TEeff=TE3−TE2−nΔTEshort (where ΔTEshort is the shortest inter-echo spacing) is any number between zero and ΔTE in this particular number or between zero and any desired echo time difference, where n is an integer. The same approach can be taken where n is a non-integer.

Although the examples presented above have focused on tissue imaging and medical imaging applications, it is to be understood that the techniques described herein may be applied to non-medical imaging applications.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to and/or receive communications from other devices. The display unit(s) may be provided, for example, to allow a user to view various information in connection with execution of the instructions. The user input device(s) may be provided, for example, to allow the user to make manual adjustments, make selections, enter data or various other information, and/or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of nuclear magnetic resonance imaging of an object, the method comprising:
    receiving MR data corresponding to n complex MR images generated using an MR scan having a series of n different echo times, where n is an integer equal to two or more, each image corresponding to a respective echo time; and
    processing the images to correct phase wrap aliasing, the processing comprising:
    i) complex dividing a second image corresponding to a second echo time with a first image corresponding to a first echo time to create a divided complex image;
    ii) using a scaling of the phase from the divided complex image to determine a predicted phase at one or more pixels in the second image;
    iii) for one or more pixels in the second image, comparing the predicted phase with a measured phase, and
    if the difference between the predicted phase and the measured phase lies within a first threshold range, leaving the measured phase in the second image unchanged;
    if the difference between the phases lies outside the first threshold range, changing the measured phase value by adding multiples of $2\pi$ until the difference falls within the threshold range.

2. The method of claim 1, the processing further comprising:
    iv) using a scaling of the phase from the divided complex image to determine a predicted phase at one or more pixels in a third image by adding the scaling of the phase to the corresponding phase from the second image;
    v) for one or more pixels in the third image, comparing the predicted phase with a measured phase, and
    if the difference between the predicted phase and the measured phase the predicted phase and the measured phase lies within a first threshold range, leaving the measured phase in the second image unchanged;
    if the difference between lies outside the first threshold range, changing the measured phase value by adding multiples of $2\pi$ until the difference falls within the threshold range.

3. The method of claim 2, further comprising, iteratively continuing the processing for images corresponding to the remaining n−3 echo times.

4. The method of claim 3, wherein, for at least one pixel, a phase difference between the first image and the second image, $\Delta\phi(r)$, computed based on complex division, is added to the phase in the first image to create a predicted phase $\phi_{new}(r, TE2)$.

5. The method of claim 4, comprising, for at least one pixel, comparing the predicted phase $\phi_{new}(r,TE2)$ with the measured phase $\phi(r,TE2)$ in the second image and:
- if $\phi_{new}(r,TE2)-\phi(r,TE2)$ is less than or equal to a threshold value, leaving (r,TE2) unmodified,
- if $\phi_{new}(r,TE2)-(\phi(r,TE2)$ is greater than a threshold value then adding or subtracting a multiple q of $2\pi$ until the absolute value of $(\phi_{new}(r,TE2)-\phi(r,TE2)+/-q2\pi)$ is less than a given value $\epsilon$.

6. The method of claim 5, wherein $\epsilon$ is about $0.1\pi$ or less.

7. The method of claim 5, wherein, for each pixel, $\epsilon$ is set to $\alpha\pi$ where $\alpha$ depends on a signal-to-noise ratio (SNR) in a magnitude image corresponding to at least one of the complex images.

8. The method of claim 7, wherein $\alpha$ is set to a multiple of 1/SNR.

9. The method of claim 8, wherein $\alpha$ is set to about 3/SNR.

10. The method of claim 1, wherein a corrected phase from the nth echo is used as input for susceptibility weighted imaging SWI analysis, where n can be any integer between 1 and p where p is the total number of echoes collected in the scan.

11. The method of claim 1, wherein a corrected phase from the nth echo is used as input for a susceptibility weighted image mapping SWIM analysis, where n can be any integer between 1 and p where p is the total number of echo collected in the scan.

12. The method of claim 1 wherein processing the images to correct phase wrap aliasing comprises:
   determining at least one low signal pixel in the MR images having a signal to noise ratio below a threshold level; and
   omitting the low signal pixel from the processing.

13. The method of claim 1, further comprising acquiring the MR data, wherein acquiring the MR data comprises acquiring magnitude data $\rho(r)$ and phase data $\phi(r)$ corresponding to each echo time; and further comprising:
   Fourier transforming k-space data associated with the MR data to generate MR images.

14. The method of claim 1, further comprising correcting the first image corresponding to the first echo time to produce an unwrapped phase image.

15. The method of claim 1, further comprising using MR data corresponding to at least three echo times to correct one or more of the MR images for local field variations.

16. The method of claim 1, further comprising correcting for eddy current gradient induced phase effects by subtracting a phase value at the center of an image for either or both of even and odd phase images and after creating an anti-aliased image adding an offset back.

* * * * *